(12) United States Patent
Panda et al.

(10) Patent No.: US 7,186,660 B2
(45) Date of Patent: Mar. 6, 2007

(54) SILICON PRECURSORS FOR DEEP TRENCH SILICON ETCH PROCESSES

(75) Inventors: Siddhartha Panda, Beacon, NY (US); Richard S. Wise, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 622 days.

(21) Appl. No.: 10/338,964

(22) Filed: Jan. 8, 2003

(65) Prior Publication Data

US 2004/0132312 A1    Jul. 8, 2004

(51) Int. Cl.
*H01L 21/302* (2006.01)
(52) U.S. Cl. ............... 438/710; 438/712; 438/719
(58) Field of Classification Search ............. 438/700, 438/710, 712, 719, 723
See application file for complete search history.

(56) References Cited

U.S. PATENT DOCUMENTS

| | | | |
|---|---|---|---|
| 6,318,384 B1 * | 11/2001 | Khan et al. ............. | 134/22.1 |
| 6,380,095 B1 | 4/2002 | Liu et al. | |
| 2002/0003126 A1 * | 1/2002 | Kumar et al. ............. | 216/67 |

OTHER PUBLICATIONS

International Critical Tables of Numerical Data, Physics, Chemistry and Technology (via www.knovel.com), 1$^{st}$ Electronic Edition; Search query: Si2Br6, SiSBr2 or SiSCl2.*

* cited by examiner

*Primary Examiner*—Nadine G. Norton
*Assistant Examiner*—Binh X. Tran
(74) *Attorney, Agent, or Firm*—Schmeiser, Olsen & Watts; Steven Capella

(57) ABSTRACT

The present invention relates to etch chemistry and methods for the etching of silicon substrates. The method is particularly useful for deep trench etching of silicon substrates and produces a trench having a high aspect ratio. In this type of deep trench etching, control of the profile of the trench is addressed by the etch chemistry disclosed herein. The etchant described in the present invention comprises silicon and a halogen component, and may be gaseous, liquid or solid. The etchant disclosed is also substantially free of hydrogen and carbon.

14 Claims, 2 Drawing Sheets

SILICON PRECURSORS FOR DEEP TRENCH SILICON ETCH PROCESSES

BACKGROUND OF THE INVENTION

1. Technical Field

The invention relates generally to a method for forming a high aspect ratio trench in a silicon substrate by contacting exposed silicon, under reactive ion etching (RIE) conditions, with an etchant which comprises oxygen, silicon and a halogen component. The etchant is also substantially free of hydrogen and carbon.

2. Related Art

Processes for the etching of silicon substrates, and particularly for the etching of deep trenches in silicon substrates, are known to be susceptible to certain deficiencies, such as varying silicon loads at the bottom of a trench due to diffusive gradients, and losses to trench sidewalls. Other relevant deficiencies include uniformity issues caused by mask erosion at the trench edges, and trench profile distortion, which may lead to the formation of side pockets in the trench walls in some severe cases.

Accordingly, there exists a need for an alternative deep trench etching method which makes the process less sensitive to silicon loading, achieves greater trench depth, and maintains or controls the trench profile.

SUMMARY OF THE INVENTION

It is therefore a feature of the present invention to overcome the above shortcomings related to deep trench etching in silicon substrates by providing a method for, and the resultant structure therefrom, deep trench etching in silicon substrates, which method provides a less load sensitive etch process, achieves greater trench depth, and maintains or controls the trench profile. Such a method and structure may be especially useful for producing, inter alia, MicroElectroMechanical Systems (MEMS), or trench capacitors used in memory (e.g., Dynamic Random access Memory (DRAM)) applications.

In a first general aspect, the present invention presents an apparatus for forming a trench in a silicon substrate, said apparatus comprising: a silicon substrate having a mask layer disposed thereon, said mask layer adapted to expose portions of said silicon substrate; and an etchant operatively applied to said exposed portions of said silicon substrate in a reactive ion etch (RIE) process, wherein said etchant comprises silicon and a halogen, and said etchant does not include hydrogen or carbon.

In a second general aspect, the present invention presents a method of forming a trench in a silicon substrate, said method comprising: providing a silicon substrate with a mask layer disposed thereon, said mask layer having at least one opening where said silicon substrate is exposed; contacting said exposed silicon substrate, under reactive ion etching conditions, with an etchant comprising silicon and a halogen, provided that said etchant is substantially free of hydrogen and carbon, wherein a trench is etched in said silicon substrate at said at least one opening.

In a third general aspect, the present invention presents an apparatus for forming a trench in a silicon substrate, said apparatus comprising: a feedstock material operatively applied to a silicon substrate, said feedstock material containing an etchant; a mask layer disposed on said silicon substrate, said mask layer adapted to expose portions of said silicon substrate; and an etchant operatively applied to said exposed portions of said silicon substrate in a reactive ion etch (RIE) process, wherein said etchant further comprises silicon and a halogen, and said etchant does not include hydrogen or carbon.

The foregoing and other features and advantages of the invention will be apparent from the following more particular description of embodiments of the invention. It is to be understood that both the foregoing general description and the following detailed description are exemplary, but are not restrictive, of the invention.

BRIEF DESCRIPTION OF THE DRAWINGS

The features and inventive aspects of the present invention will become more apparent upon reading the following detailed description, claims and drawings, of which the following is a brief description.

DETAILED DESCRIPTION OF THE EMBODIMENTS

The following is a detailed explanation of the method for forming, and resultant structure of, a deep trench according to the present invention. It should be noted that the same reference numbers are assigned to components having approximately the same functions and structural features in the following explanation and the attached drawings to preclude the necessity for repeated explanation thereof.

As a preface to the detailed description, it should be noted that, as used in this specification and the appended claims, the singular forms "a", "an" and "the" include plural referents, unless the context clearly dictates otherwise. Specific terminology of particular importance to the description of the present invention is defined below.

The term "aspect ratio" refers to the ratio of the height dimension to the width dimension of a particular opening, and includes, but is not limited to, a trench opening wherein the cross-sectional profile has an aspect ratio which is the height of the trench divided by the smallest opening (i.e., width) dimension.

Figure 1:
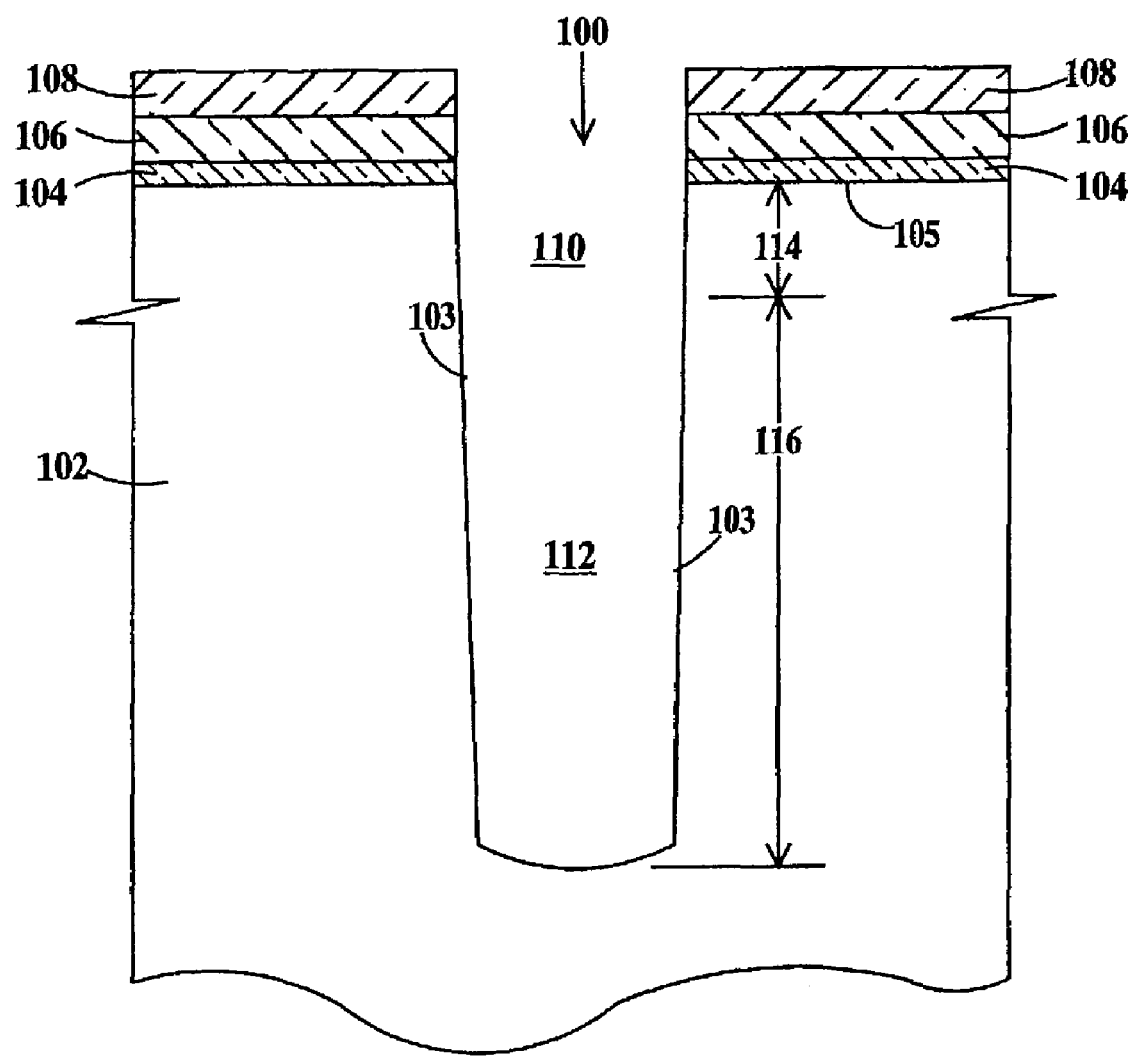
FIG. 1 is a schematic illustrating a typical deep trench etched in a silicon substrate of the related art.
Figure 2:
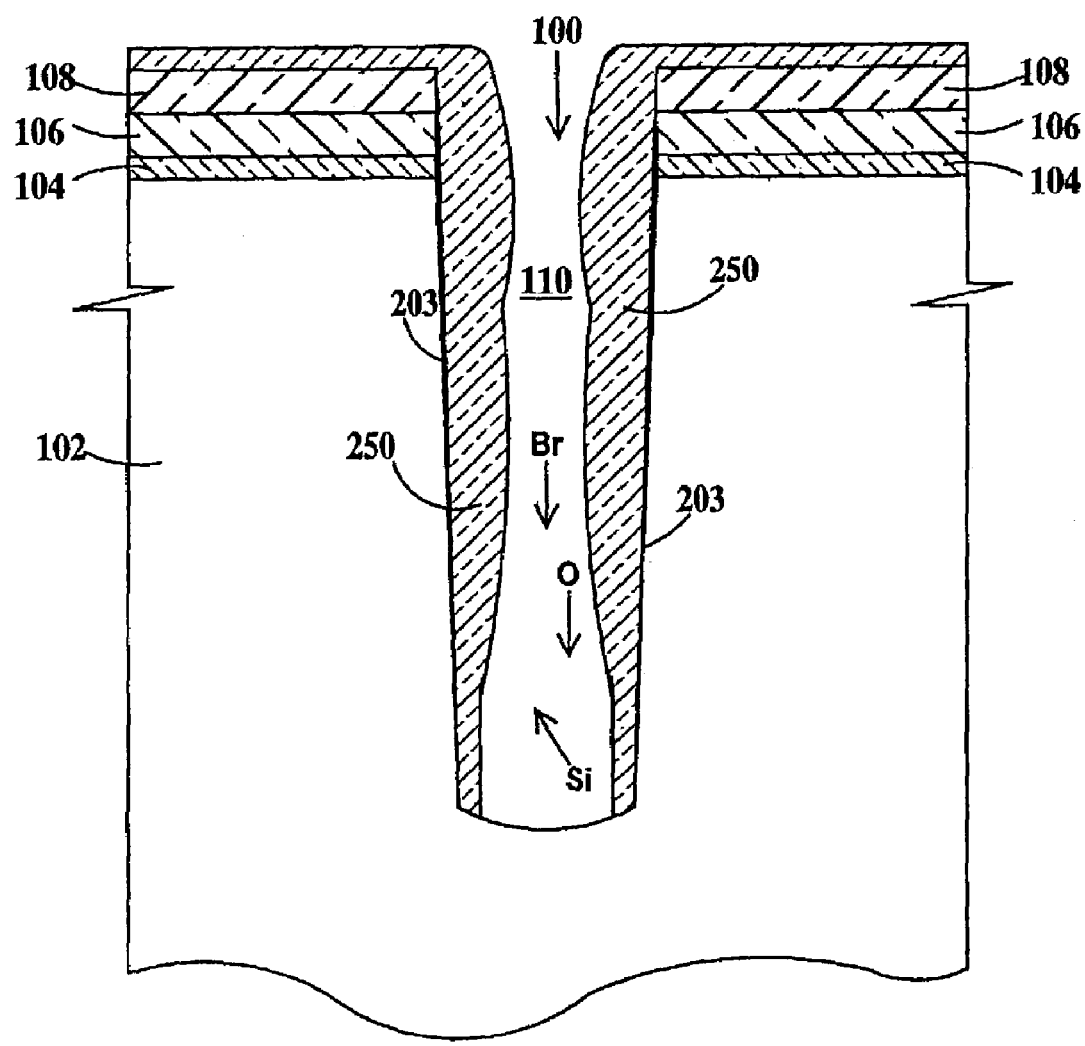
FIG. 2 is a schematic illustrating a deep etched silicon trench structure in accordance with an embodiment of the present invention.

The term "etch profile" includes but is not limited to the three-dimensional shape of the etched surface (including taper angles). When looking at the cross-sectional view of the etched surface, for example the etched trenches which are illustrated in FIGS. 1 and 2 herein, the etch profile typically is referenced to the angle of the taper or to the general shape of the cross-sectional view at a given location from top to bottom of the etched trench.

The term "feature" includes but is not limited to metal lines, trenches and openings in a dielectric layer, and other structures which make up the topography of the substrate surface. Feature size often refers to the size of the smallest feature on a wafer.

The term "selectivity" is used to refer to one or both of: a) a ratio of etch rates of two materials; and b) a condition achieved during etch when the etch rate of one material is increased in comparison with another material. Note that there are various kinds of materials included in a stack of layers used in an etching process.

The term "stack" or "etch stack" includes but is not limited to a collection of layers of different materials deposited one over the other, at least a portion of which are etched during an etching process.

The term "taper" includes but is not limited to the gradual diminution of cross-sectional opening of the trench from the top toward the bottom. The taper is typically described in degrees with reference to the horizontal surface at the top of the trench. For example, a 90 degree angle would provide a vertical sidewall which has essentially zero taper. An angle less than 90 degree provides a taper. An individual trench may exhibit more than one taper over its sidewall depth.

Referring to FIG. 1, a typical representative trench structure 100 is shown. Trench structure 100 includes a silicon substrate 102, a dielectric pad oxide layer 104, a masking layer 106, and a patterning layer 108. Typically the dielectric pad oxide layer 104 is silicon dioxide, the masking layer 106 is silicon nitride, and the patterning layer 108 material is borosilicate glass (BSG) or a silicon oxide generated using tetraethyl orthosilicate (TEOS), or a combination thereof. In some applications, a dielectric Anti-Reflective Compound (ARC) layer (not shown) such as siliconoxynitride may be used in combination with the patterning layer 108.

In an exemplary embodiment, the top portion 110 of the trench 103, which extends from the silicon surface 105 into the silicon substrate 102 a depth 114 of about 1.5 μm (microns) is specified to taper at an angle of 88.5+/−0.5 degrees. In general, the angle range may include angles from about 87 degrees to about 89 degrees. If the taper were lower, at an angle of 85 degrees, for example, when the critical diameter of the trench is particularly small, for example 0.18 μm, the opening can be closed off completely if the etch varies during processing. The bottom portion 112 of the trench 103, which extends beneath the top portion 110 for an additional depth 116 of about 6.5 μm is specified to taper at an angle of 89.5+/−0.5 degrees. The bottom of the trench is preferably rounded, and this rounding occurs naturally. The bottom portion 112 of the trench may be bottle shaped rather than tapered.

The typical trench structure 100 of FIG. 1 can be formed by applying one or more etch process precursors to the feed gas. The precursors may be any suitable materials which are added to the feed gas such that the feed gas acts as a delivery mechanism for the precursors. The feedstock material or feed gas are supplied to the target substrate from a pre-reactor (not shown) wherein the precursors are combined with the feedstock material or feed gas.

Referring to FIG. 2, a representative trench structure 200 of the present invention is shown. Trench structure 200 results from a high aspect ratio trench etch process which proceeds by simultaneous silicon etching and deposition of a passivation film 250. Passivation film 250 protects the sidewalls of the trench 203 from lateral etching. The deposited passivation film 250 is also a component in the protection of the mask layers 106 and 108. The passivation film 250 is a halogen-containing compound which may be, inter alia, silicon oxybromide ($SiO_xBr_y$) as discussed below for illustrative purposes.

The relevant chemical reaction from which the passivation layer is produced may be represented by the following:

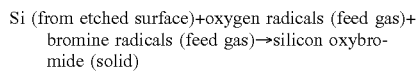

While oxygen and bromine precursors are provided by dissociation of the feed gas, the silicon component (i.e., the portion, of the resultant chemical composition, containing silicon) comes from the etched surface of the silicon substrate 102. Thus, there is no independent control of the gas phase silicon load in the etch system, since the amount of silicon substrate 102 that is etched depends on the silicon etch rate. Moreover, the silicon etch rate is also affected by other process parameters such as, inter alia, etch material selectivity. As the trench depth and the aspect ratio increase, spatial gradients in the available silicon and hence silicon oxybromide deposition rate are formed, as silicon is unable to diffuse out of the high aspect ratio trench. Adjustment of the Reactive Ion Etch (RIE) parameters to enhance deposition generally result in excessive $SiO_xBr_y$ deposition in the trench and consequent taper or etch stop.

An alternative approach, as disclosed in the present invention, is to provide a precursor component containing silicon in the feedstock gas. The addition of a silicon precursor component to the feedstock gas provides for increasing selectivity, which is valuable for achieving greater trench depth. The passivation film 250 is also deposited on the oxide masking layer 108 surface, thereby enhancing selectivity and thus allowing for an increased etching time which is also useful for obtaining deeper trenches. A gas phase source of silicon is critical here, especially at high aspect ratios, since the silicon load out of the trench 203 is reduced by diffusive gradients and Knudsen flow losses to the trench sidewalls.

The addition of a precursor component containing silicon to the feedstock gas also provides for an etching process which is less loading sensitive. Typically, masking layer 108 erosion is severe at the wafer edge where there is less silicon load relative to the wafer center. This masking layer 108 erosion limits the etch time, and thus affects the achievable trench depth. Furthermore, this masking layer 108 erosion exacerbates uniformity issues within the masking layer 108 itself.

The addition of a precursor component containing silicon to the feedstock gas provides a mechanism for controlling the trench profile when the passivation layer 250 formation becomes silicon-depleted. As feature size (r) decreases, the surface-to-volume ratio of the feature size increases. So, there is proportionately less silicon for the sidewall passivation layer 250 available from the substrate than if silicon-depleted condition did not occur. Also, the etch rate decreases due to reactant and ion flux reductions with the high aspect ratio trench. When silicon becomes the rate limiting component, it affects formation of a passivation layer 250. This potentially leads to profile distortion. In severe cases, the lack of passivation layer 250 could lead to the formation of side pockets in the trench sidewalls, rendering the trench sidewalls useless.

The precursor component containing silicon is intended to replace other constituents which are known and used. Constituents such as hydrogen (H) and carbon (C) are to be avoided since they may enhance erosion of the oxide mask or interfere with $SiO_xBr_y$ formation. Hydrogen reacts with flourine ($F_2$) to form hydroflouric acid (HF) which attacks the oxide mask and also performs a strong lateral etch which may affect the sidewalls of the trench. Similarly, carbon facilitates undesirable etching of the oxide mask by forming oxides of carbon, and may cause pitting in the trench sidewalls.

Therefore, the present invention proposes limiting the other constituents, of the precursor component containing silicon, to mainly halogens (e.g., F, Cl, Br, I) or halogen-containing compounds which are etchants. Thus, primary etchants such as $NF_3$, HBr, $Cl_2$, etc. can be partially replaced. Sulfur is included as a potential constituent, since it has been found to improve sidewall morphology and could also mitigate undesirable effects like side pockets.

The present invention is also directed towards the physical state of the precursors. Currently, only gas-phase precursors are used for delivery due to logistical reasons. The present invention includes solid and liquid precursors as well. These precursors are constituted using heavy halogen (e.g., Br, I) etchants to partially replace the feedgas. The difficulties associated with utilizing non-gaseous materials as precursors can be mitigated by using a reactant delivery system which includes a pre-reactor assembly. Such a pre-reactor assembly is disclosed in the related patent application, Ser. No. 10/336,148, entitled "Pre-reactor FIS9-2002-0136", assigned to a common assignee as the present disclosure, and incorporated herein by reference. Reactive gaseous species are formed in the pre-reactor assembly, after which the species are fed directly to the primary etching chamber.

The present invention utilizes the following halogen-containing precursor materials listed below along with several pertinent characteristics:

| Precursor | State @ STP* | Melting Point (° C.) | Boiling Point (° C.) |
|---|---|---|---|
| $SiCl_2F_2$ | gas | −144 | −31.7 |
| $SiClF_3$ | gas | −138 | −70 |
| $SiBrCl_3$ | liquid | −62 | 80.3 |
| $SiBr_2Cl_2$ | liquid | −45.5 | 104 |
| $SiBr_3Cl$ | liquid | −20.8 | 126 |
| $Si_2Br_6$ | solid | 95 | 240 |
| $SiSBr_2$ | solid | 93 | 150 |
| $SiSCl_2$ | solid | 75 | 92 |
| $SiI_4$ | solid | 120.5 | 287.5 |
| $Si_2I_6$ | solid | 250 | — |

*Note:
State @ STP is herein defined as the materials state at Standard Temperature and Pressure (STP), i.e., 25 degrees Centigrade and 1 atm.

The precursor materials used in the present state of the art processes are limited to simple diatomic ones in the gas phase at STP (e.g., $SiF_4$, $SiCl_4$). Use of precursors with more than one etchant can be used to utilize the advantage of the types thus used, instead of providing each type separately. For instance, compounds such as, inter alia, $SiCl_2F_2$ and $SiClF_3$ which have different ratios of Cl and F atoms, could be used concurrently. Also, liquid and solid phase precursors can be used concurrently. These precursors can be effectively used to address issues of selectivity, uniformity and profile control.

These precursor materials have the following advantages:
1. They do not introduce undesirable species (e.g., H, C) into the etching chamber.
2. They provide low dissociation energy precursors for Si.

Embodiments of the present invention have been disclosed. A person of ordinary skill in the art would realize, however, that certain modifications would come within the teachings of this invention. For example, rather than the particular transistor technology represented by the embodiment discussed herein regarding FIG. 2, the present invention also encompasses embodiments incorporating other transistor technologies. Similarly, inversions of the signals may be included. Therefore, the following claims should be studied to determine the true scope and content of the invention.

What is claimed is:

1. A method of forming a trench in a silicon substrate, said method comprising:
   providing a silicon substrate with a mask layer disposed thereon, said mask layer having at least one opening where said silicon substrate is exposed;
   forming a precursor in a pre-reactor assembly, said a precursor comprising silicon and a halogen;
   sending the precursor from the pre-reactor assembly to an etching chamber; and
   contacting said exposed silicon substrate in the etching chamber, under reactive ion etching conditions, with an etchant comprising said precursor, wherein said etchant is substantially free of hydrogen and carbon, wherein a trench is etched in said silicon substrate at said at least one opening.

2. The method of claim 1, wherein said etchant further comprises at least one of sulfur and oxygen.

3. A method of forming a trench in a silicon substrate, said method comprising:
   providing a silicon substrate with a mask layer disposed thereon, said mask layer having at least one opening where said silicon substrate is exposed;
   contacting said exposed silicon substrate in an etching chamber, under reactive ion etching conditions, with an etchant comprising a first precursor and a second precursor, wherein the first precursor and the second precursor each comprise silicon and a halogen, wherein the first precursor and the second precursor are subject to a constraint of the first precursor and the second precursors having a different chemical structure, wherein the first precursor and the second precursor are each in a gaseous state, wherein said etchant is substantially free of hydrogen and carbon, and wherein a trench is etched in said silicon substrate at said at least one opening, said method further comprising prior to said contacting said exposed silicon substrate in said etching chamber;
   forming the first precursor and the second precursor in a pre-reactor assembly; and
   sending the first precursor and the second precursor from the pre-reactor assembly to the etching chamber.

4. The method of claim 3, wherein said etchant further comprises oxygen.

5. The method of claim 3, wherein said etchant further comprises sulfur.

6. A method of forming a trench in a silicon substrate, said method comprising:
   providing a silicon substrate with a mask layer disposed thereon, said mask layer having at least one opening where said silicon substrate is exposed;
   contacting said exposed silicon substrate in an etching chamber, under reactive ion etching conditions, with an etchant comprising a first precursor, wherein the first precursor comprises silicon and a halogen, wherein the first precursor is in a liquid state or a solid state, wherein said etchant is substantially free hydrogen and carbon, and wherein a trench is etched in said silicon substrate at said at least one opening.

7. The method of claim 6, wherein the first precursor is in the liquid state.

8. The method of claim 7, wherein said etchant further comprises oxygen.

9. The method of claim 7, wherein said etchant further comprises sulfur.

10. The method of claim 7, wherein the first precursor is selected from the group consisting of $SiBrCl_3$, $SiBr_2Cl_2$, and $SiBr_3Cl$.

11. The method of claim 7, wherein the etchant comprises a second precursor, wherein the second precursor is in the liquid state, and wherein the first precursor and the second precursor are subject to a constraint of the first precursor and the second precursor having a different chemical structure.

12. The method of claim 11, wherein the first precursor and the second precursor are each selected from the group consisting of $SiBrCl_3$, $SiBr_2Cl_2$, and $SiBr_3Cl$ subject to said constraint.

13. The method of claim 7, wherein the etchant comprises a second precursor, and wherein the second precursor is in the solid state.

14. The method of claim 13, wherein the first precursor is selected from the group consisting of $SiBrCl_3$, $SiBr_2Cl_2$, and $SiBr_3Cl$, and the wherein second precursor is selected from the group consisting of $Si_2Br_6$, $SiSBr_2$, $SiSCl_2$, $SiI_4$, and $Si_2I_6$.

* * * * *